United States Patent
Kanteti

(10) Patent No.: US 11,146,261 B1
(45) Date of Patent: Oct. 12, 2021

(54) PROCESS CONTROLLED OUTPUT DRIVER STAGGERING

(71) Applicant: Texas Instruments Incorporated, Dallas, TX (US)

(72) Inventor: Amar Kanteti, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/092,977

(22) Filed: Nov. 9, 2020

Related U.S. Application Data

(60) Provisional application No. 63/076,499, filed on Sep. 10, 2020.

(51) Int. Cl.
*H03K 17/14* (2006.01)

(52) U.S. Cl.
CPC .................................. *H03K 17/145* (2013.01)

(58) Field of Classification Search
CPC .................................................. H03K 17/145
USPC ........................................................ 327/378
See application file for complete search history.

(56) References Cited

U.S. PATENT DOCUMENTS

| | | | |
|---|---|---|---|
| 8,085,081 B2* | 12/2011 | Ogawa | H03K 17/163 327/393 |
| 2004/0012434 A1* | 1/2004 | Courau | H03F 3/72 327/391 |
| 2019/0007046 A1* | 1/2019 | Graves | H03K 19/0002 |
| 2019/0334519 A1* | 10/2019 | Sawada | H03K 17/167 |
| 2020/0313674 A1* | 10/2020 | Kanteti | H03K 19/018521 |

* cited by examiner

*Primary Examiner* — Metasebia T Retebo
(74) *Attorney, Agent, or Firm* — Ray A. King; Charles A. Brill; Frank D. Cimino

(57) ABSTRACT

An output buffer includes a first group of stagger FETs coupled in parallel between a power lead and an output signal lead and a second group of stagger FETs coupled in parallel between the output signal lead and a ground lead. Each stagger FET has a gate coupled to a respective base resistor and a respective adjustable resistor. A first group of bypass FETs and a second group of bypass FETs are each coupled across the terminals of a respective adjustable resistor and the gates of the bypass FETs are coupled to either a first process-sensing signal lead or a second process-sensing signal lead.

20 Claims, 9 Drawing Sheets

435 — PROVIDE A FIRST SENSE RESISTOR

FIG. 4B

440 — PROVIDE A FIRST NFET AND A FIRST PFET, A DRAIN OF THE FIRST NFET COUPLED TO A SOURCE OF THE FIRST PFET AND TO THE FIRST RESISTIVE TERMINAL, A SOURCE OF THE FIRST NFET COUPLED TO A DRAIN OF THE FIRST PFET AND TO THE SECOND RESISTIVE TERMINAL, A GATE OF THE FIRST NFET COUPLED TO AN OUTPUT DOMAIN SUPPLY LEAD, AND A GATE OF THE FIRST PFET COUPLED TO THE GROUND LEAD

FIG. 4C

445 — PROVIDE A SECOND RESISTIVE ELEMENT HAVING A THIRD RESISTIVE TERMINAL AND A FOURTH RESISTIVE TERMINAL, THE THIRD RESISTIVE TERMINAL COUPLED TO THE SECOND PROCESS-SENSING INPUT LEAD

450 — PROVIDE AN XNOR GATE HAVING A FIRST XNOR INPUT, A SECOND XNOR INPUT, AND AN XNOR OUTPUT, THE FIRST XNOR INPUT BEING COUPLED TO THE SECOND PROCESS-SENSING INPUT LEAD, THE SECOND XNOR INPUT BEING COUPLED TO THE FOURTH RESISTIVE TERMINAL

455 — PROVIDE A SECOND CAPACITOR HAVING A THIRD CAPACITIVE TERMINAL AND A FOURTH CAPACITIVE TERMINAL, THE THIRD CAPACITIVE TERMINAL COUPLED BETWEEN THE FOURTH RESISTIVE TERMINAL AND THE SECOND XNOR INPUT AND THE FOURTH CAPACITIVE TERMINAL COUPLED TO THE GROUND LEAD

FIG. 4D

460 — PROVIDE A SECOND SENSE RESISTOR

FIG. 4E

465 — PROVIDE A SECOND NFET AND A SECOND PFET, A DRAIN OF THE SECOND NFET COUPLED TO A SOURCE OF THE SECOND PFET AND TO THE THIRD RESISTIVE TERMINAL, A SOURCE OF THE SECOND NFET COUPLED TO A DRAIN OF THE SECOND PFET AND TO THE FOURTH RESISTIVE TERMINAL, A GATE OF THE SECOND NFET COUPLED TO AN OUTPUT DOMAIN SUPPLY LEAD, AND A GATE OF THE SECOND PFET COUPLED TO THE GROUND LEAD

FIG. 4F

470 — COUPLE A FIRST BOOST FET IN SERIES WITH A SECOND BOOST FET BETWEEN AN OUTPUT DOMAIN POWER LEAD AND THE OUTPUT SIGNAL LEAD, THE SECOND BOOST FET HAVING A GATE COUPLED TO THE FIRST GATE CONTROL SIGNAL LEAD

475 — COUPLE A THIRD BOOST FET IN SERIES WITH A FOURTH BOOST FET BETWEEN THE OUTPUT SIGNAL LEAD AND THE GROUND LEAD, THE THIRD BOOST FET HAVING A GATE COUPLED TO THE SECOND GATE CONTROL SIGNAL LEAD

480 — CONTROL THE FIRST BOOST FET USING AN INVERTED VERSION OF THE FIRST PULSE

485 — CONTROL THE FOURTH BOOST FET USING AN INVERTED VERSION OF THE SECOND PULSE

FIG. 4G

PROCESS CONTROLLED OUTPUT DRIVER STAGGERING

PRIORITY UNDER 35 U.S.C. § 119(e) & 37 C.F.R. § 1.78

This non-provisional application claims priority based upon the following prior United States provisional patent application(s): (i) "PROCESS CONTROLLED OUTPUT DRIVER STAGGERING," Application No. 63/076,499, filed Sep. 10, 2020, in the name(s) of Amar Kanteti, which is hereby incorporated by reference in its entirety.

BACKGROUND

When an integrated circuit (IC) design is implemented on a semiconductor wafer, the parameters used in the fabrication process, e.g., the thickness of a layer or the density of doping, may vary across different wafers and/or different regions of the wafer. In a circuit using metal/oxide/semiconductor field effect transistors (MOSFETs), basic MOSFET parameters such as drain current (ID) and threshold voltage (VT), will vary according to the variations in the parameters. Process corners represent the extremes of these parameter variations within which the circuit must still function correctly. A circuit running on devices fabricated at these process corners may run slower or faster than specified and at lower or higher temperatures and voltages, so long as it remains within an acceptable range.

In an example using an output driver, when the extreme variations provide, e.g., a faster response than specified, the extreme may be considered a "strong" corner, while extreme variations that provide, e.g., a slower response, may be considered a weak corner; a nominal corner meets expected values. When staggering is used in an output driver, typical staggering processes perform greater staggering in a weak process corner and at lower voltages and less staggering in a strong process corner and at higher voltages, which is opposite to the desired response. Other types of circuits may experience similar issues of process variations that do not demonstrate a favorable correspondence with a desired outcome.

SUMMARY

Disclosed embodiments provide the stagger resistance using both a base resistor and an adjustable resistor coupled to the gate of each of the stagger field effect transistors (FETs). A bypass FET is coupled in parallel with each of the adjustable resistors so that the adjustable resistors can be selectively bypassed. A process-sensing circuit receives a gate control signal for the output driver and produces a pulse that is longer in the weak process corner and shorter in the strong process corner and may also vary in relation to the voltage used. The process-sensing circuit is discussed in the context of an output driver on a voltage level translator chip, but can also be utilized in various other circuits to adjust a response across process variations.

In one aspect, an embodiment of an electronic device is disclosed. The electronic device includes a first group of stagger field effect transistors (FETs) coupled in parallel between an output domain power lead and an output signal lead, a gate of each of the first group of stagger FETs being coupled to a respective first base resistor and a respective first adjustable resistor, the respective first base resistors and the respective first adjustable resistors being coupled in series and coupled to a first gate control signal lead; a first group of bypass FETs, each of the first group of bypass FETs being coupled across the terminals of the respective first adjustable resistor, a gate of each of the first group of bypass FETs being coupled to a first process-sensing signal lead; a second group of stagger FETs coupled in parallel between the output signal lead and a ground lead, a gate of each of the second group of stagger FETs being coupled to a respective second base resistor and a respective second adjustable resistor, the respective second base resistors and the respective second adjustable resistors being coupled in series and coupled to a second gate control signal lead; and a second group of bypass FETs, each of the second group of bypass FETs being coupled across the terminals of the respective second adjustable resistor, a gate of each of the second group of bypass FETs being coupled to a second process-sensing signal lead.

In another aspect, an embodiment of a method of performing staggering in an output driver having a first gate control signal lead, a second gate control signal lead, and an output signal lead is disclosed. The method includes providing a first process-sensing circuit having a first process-sensing input lead and a first process-sensing output lead, the first process-sensing input lead being coupled to the first gate control signal lead; providing a second process-sensing circuit having a second process-sensing input lead and a second process-sensing output lead, the second process-sensing input lead being coupled to the second gate control signal lead; and during staggering in the output driver, selectively bypassing a first group of adjustable stagger resistors based on a first pulse provided on the first process-sensing output lead, selectively bypassing a second group of adjustable stagger resistors based on a second pulse provided on the second process-sensing output lead, and selectively boosting an output signal on the output signal lead based on the first pulse and the second pulse.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

FIG. 4A through FIG. 4G provide either clarification of the elements of FIG. 4 or additional elements thereof;

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 6:
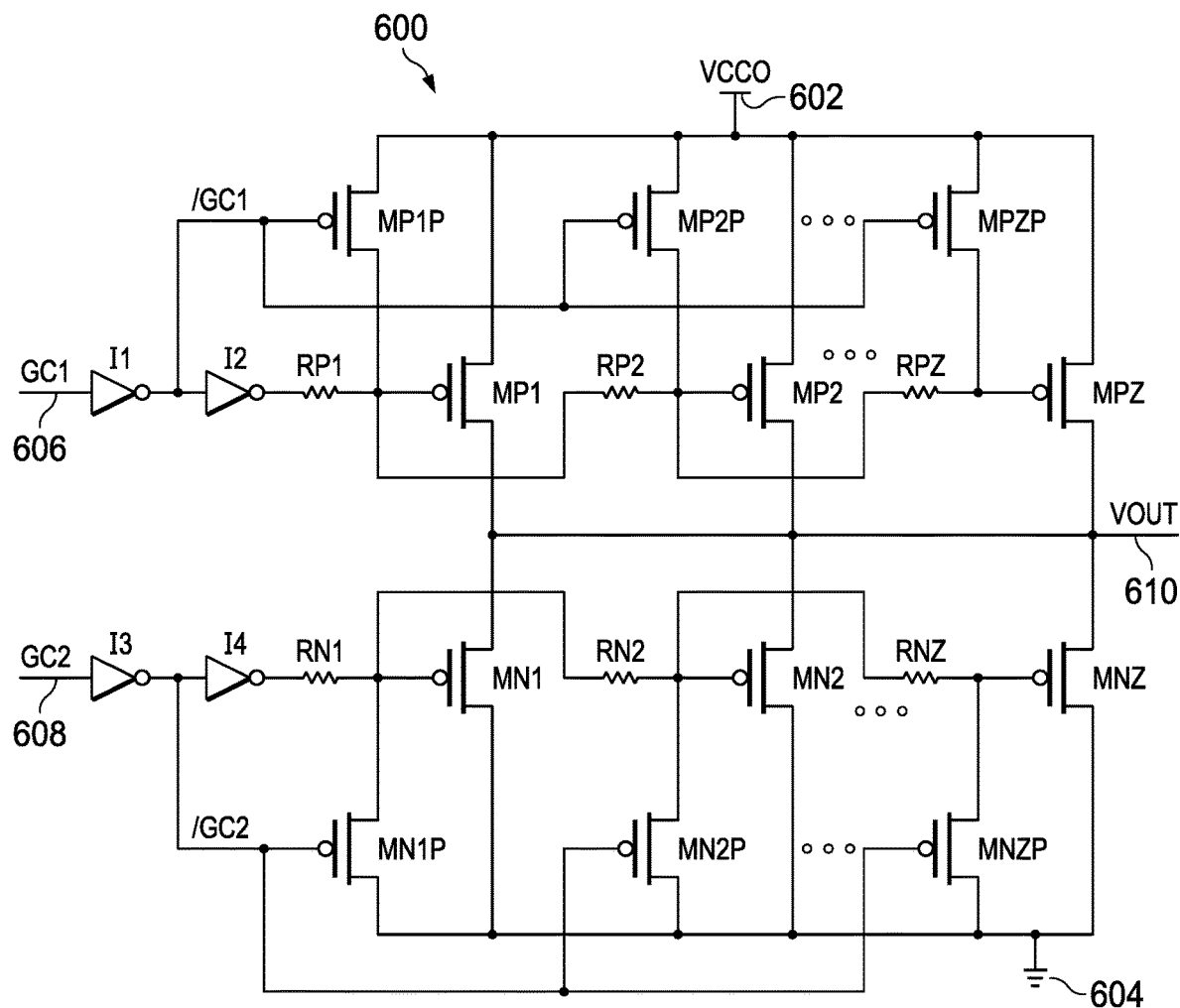
FIG. 6 depicts an output buffer with staggering according to the prior art.

FIG. 6 depicts an example of an output stage 600 that is using staggering according to a prior art example. Output stage 600 is coupled to a output domain power lead 602, which can be coupled to a supply voltage VCCO, and to a ground lead 604, which can be coupled to a ground plane. Output stage 600 is further coupled to a first gate control signal lead 606, a second gate control signal lead 608, and an output signal lead 610. The first gate control signal lead 606 is coupled to an input of a first inverter I1, while an output of the first inverter I1 is coupled to an input of a second inverter I2. Similarly, the second gate control signal lead 608 is coupled to an input of a third inverter I3 and an output of the third inverter I3 is coupled to an input of a fourth inverter I4.

A first group of stagger field effect transistors (FETs) MP1, MP2 . . . MPZ, which in one embodiment are P-type FETs (PFETs), are coupled in parallel between the output domain power lead 602 and the output signal lead 610. A gate of each of the first group of stagger FETs MP1, MP2 MPZ are coupled to a respective first resistor RP1, RP2 . . . RPZ. The respective first resistors RP1, RP2 . . . RPZ are coupled in series and are also coupled to an output of the second inverter I2. A group of pull-up FETs MP1P, MP2P . . . MPZP are coupled between the output domain power lead 602 and a gate of a respective one of the first group of stagger FETs MP1, MP2 . . . MPZ. A gate of each of the group of pull-up FETs MP1P, MP2P . . . MPZP are coupled to the output of the first inverter I1.

A second group of stagger FETs MN1, MN2 . . . MNZ, which in one embodiment are N-type FETs (NFETs), are coupled in parallel between the output signal lead 610 and the ground lead 604. A gate of each of the second group of stagger FETs MN1, MN2 . . . MNZ are coupled to a respective second resistor RN1, RN2 . . . RNZ. The respective second resistors RN1, RN2 . . . RNZ are coupled in series and are also coupled to an output of the fourth inverter I4. A group of pull-down FETs MN1P, MN2P . . . MNZP are coupled between a gate of a respective one of the second group of stagger FETs MN1, MN2 . . . MNZ and the ground lead 604, while a gate of each of the group of pull-down FETs MN1P, MN2P . . . MNZP are coupled to the output of the third inverter I3.

During operation of output stage 600, a first gate control signal GC1 and a second gate control signal GC2 alternate carrying a high signal. When the first gate control signal GC1 goes high, the gate of each of the first group of stagger FETs MP1, MP2 . . . MPZ is turned on with a slight delay between each successive turn-on, e.g., a nanosecond (ns), due to the resistance of respective first resistors RP1, RP2 . . . RPZ. This delayed turn-on means that the output signal VOUT rises more slowly than if all of the transistors were turned on at the same time. When the first gate control signal GC1 goes low, the first inverse gate control signal /GC1 goes high and each of the group of pull-up FETs MP1P, MP2P . . . MPZP turns on to quickly turn off each of the first group of stagger FETs MP1, MP2 . . . MPZ.

Similarly, when the second gate control signal GC2 goes high, the gate of each of the second group of stagger FETs MN1, MN2 . . . MNZ is turned on with the same slight delay between successive turn-ons due to the resistance of respective second resistors RN1, RN2 . . . RNZ. The delayed turn-on means that the output signal VOUT drops more slowly than if all of the second group of stagger FETs MN1, MN2 . . . MNZ are turned on at the same time. When the second gate control signal GC2 goes low, the second inverse gate control signal /GC2 goes high, each of the group of pull-down FETs MN1P, MN2P . . . MNZP turns on to quickly turn off each of the second group of stagger FETs MN1, MN2 . . . MNZ.

The staggering technique can be used to reduce the noise from quickly changing currents and to provide monotonic output signals. In general, the noise is higher at higher supply voltages, strong process corners, and low temperatures (e.g., at −40 C, the drain/source current Ids at the nominal supply voltage IDSAT is high). Conversely, the data rate is lower at lower supply voltages, weak process corners, and high temperatures (e.g., at 125 C, the drain current Id is lower). To maintain both a good data rate and monotonic outputs, the stagger resistance would ideally be higher at higher voltages and lower at lower voltages, be higher at strong process corners and lower at weak process corners, and be inversely related to temperature. However, resistance characteristics do not vary with voltage and have higher values at weak process corners and lower values at strong process corners, although they may have a negative temperature coefficient of resistance. Because of these problems, an optimum data rate with good noise performance is not achieved across process and voltage.

Figure 1:
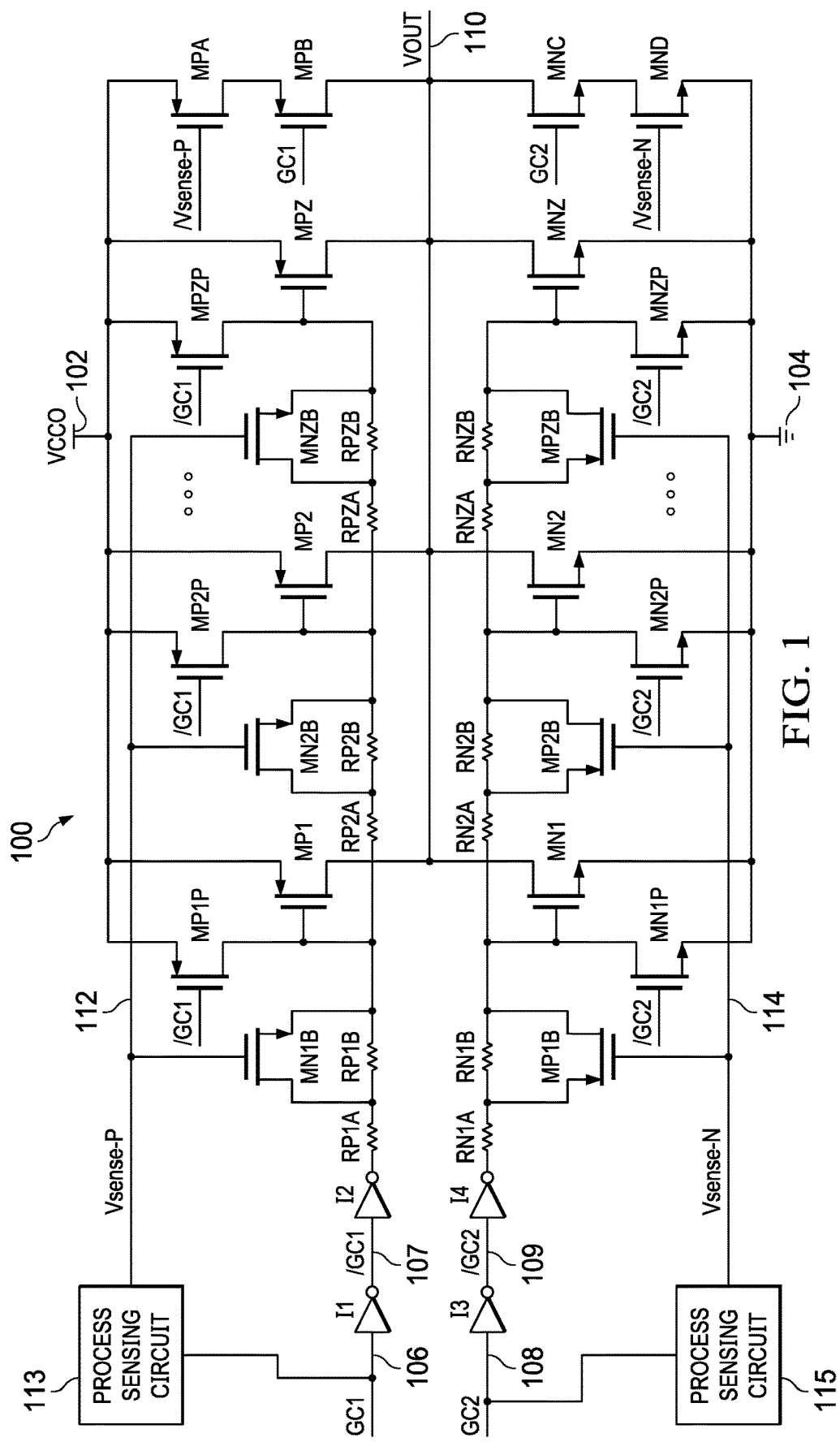
FIG. 1 depicts an example of an output buffer that implements the disclosed process-controlled staggering according to an embodiment of the disclosure.

Turning to FIG. 1, output buffer circuit 100 has been modified from output stage 600. A first gate control signal lead 106 is coupled to an input of the first inverter I1 and an output of the first inverter I1 is coupled to an input of the second inverter I2 through a first inverse gate control signal lead 107; a second gate control signal lead 108 is coupled to an input of the third inverter I3 and an output of the third inverter I3 is coupled to the input of the fourth inverter I4 through a second inverse gate control signal lead 109. Output buffer circuit 100 contains the first group of stagger FETs MP1, MP2 MPZ, which are coupled in parallel between the output domain power lead 102 and the output signal lead 110, and also contains the group of pull-up FETs MP1P, MP2P . . . MPZP, which are coupled in parallel between the output domain power lead 102 and the gate of a respective one of the first group of stagger FETs MP1, MP2 . . . MPZ. The gate of each of the group of pull-up FETs MP1P, MP2P . . . MPZP is coupled to the first inverse gate control signal lead 107. However, the gate of each of the first group of stagger FETs MP1, MP2 . . . MPZ is coupled to both a respective first base resistor RP1A, RP2A . . . RPZA and a respective first adjustable resistor RP1B, RP2B . . . RPZB. The first base resistors RP1A, RP2A . . . RPZA and the first adjustable resistors RP1B, RP2B . . . RPZB are coupled in series and are also coupled to the output of the second inverter I2. This application distinguishes between "base" resistors, which provide a base level of resistance, and "adjustable" resistors, which may be bypassed for variable amounts of time to adjust the overall resistance provided. To accomplish this variability, a first group of bypass FETs MN1B, MN2B . . . MNZB, is provided, which in one implementation are NFETs. Each of the first group of bypass FETs MN1B, MN2B . . . MNZB have a respective source and a respective drain coupled across the terminals of a respective first adjustable resistor. A gate of each of the first group of bypass FETs MN1B, MN2B . . . MNZB is coupled to a first process-sensing signal lead 112. The first process-sensing sensing lead 112 is coupled to a first process-sensing circuit 113, which receives the first gate control signal GC1 as an input and provides a first process-sensing signal Vsense-P as an output. Embodiments of the first process-sensing circuit 113 are discussed in FIGS. 2A and 2B.

Output buffer circuit 100 further contains the second group of stagger FETs MN1, MN2 . . . MNZ, which are coupled in parallel between the output signal lead 110 and the ground lead 104, and contains the group of pull-down FETs MN1P, MN2P . . . MNZP, which are coupled in parallel between the gate of a respective one of the second group of stagger FETs MN1, MN2 . . . MNZ and the ground lead 104. The gate of each of the group of pull-down FETs MN1P, MN2P . . . MNZP is coupled to the second inverse gate control signal lead 109. The gate of each of the second group of stagger FETs MN1, MN2 . . . MNZ is coupled to a respective second base resistor RN1A, RN2A . . . RNZA and a respective second adjustable resistor RN1B, RN2B . . . RNAB. The respective second base resistors RN1A, RN2A . . . RBZA and the respective second adjustable resistors RN1B, RN2B RBZB are coupled in series and are also coupled to the output of the fourth inverter I4. A second group of bypass FETs MP1B, MP2B . . . MPZB is provided, which in one implementation are PFETs. Each of the second group of bypass FETs MP1B, MP2B . . . MPZB have a respective source and a respective drain coupled across the terminals of a respective second adjustable resistor RN1B, RN2B . . . RNAB. The gate of each of the second group of bypass FETs MP1B, MP2B . . . MPZB is coupled to a second process-sensing signal lead 114. The second process-sensing sensing lead 114 is coupled to a second process-sensing circuit 115, which receives the second gate control signal GC2 as an input and provides a second process-sensing signal Vsense-N as an output. Embodiments of the second process-sensing circuit 115 are discussed in FIGS. 2C and 2D.

In addition to providing staggering that is stronger in high voltages and strong process corners, output buffer circuit 100 also contains a set of boost FETs that can boost the output signal VOUT in low voltages and weak process corners. A first boost FET MPA is coupled in series with a second boost FET MPB between the output domain power lead 102 and the output signal lead 110; a third boost FET MNC is coupled in series with a fourth boost FET MND between the output signal lead 110 and the ground lead 104. A gate of the first boost FET MPA is coupled to an inverse of the first process-sensing signal lead 112, while a gate of the second boost FET MPB is coupled to the first gate control signal lead 106. A gate of the third boost FET MNC is coupled to the second gate control signal lead 108 and a gate of the fourth boost FET MND is coupled to an inverse of the second process-sensing signal lead 114.

Figure 2A:
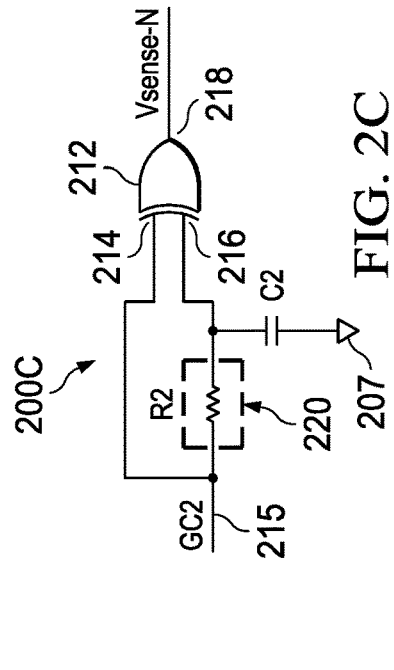
FIG. 2A illustrates a process-sensing circuit according to an embodiment of the disclosure.
Figure 2C:
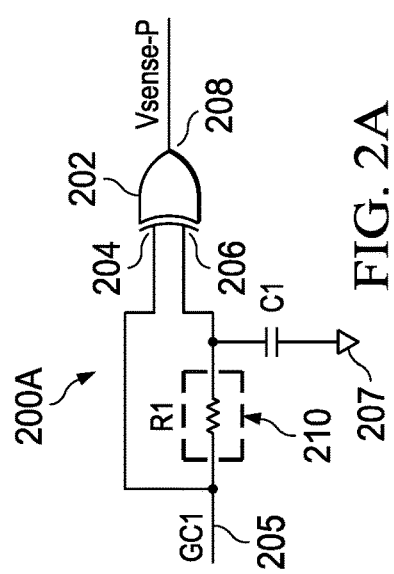
FIG. 2C illustrates a process-sensing circuit according to an embodiment of the disclosure.
Figure 2B:
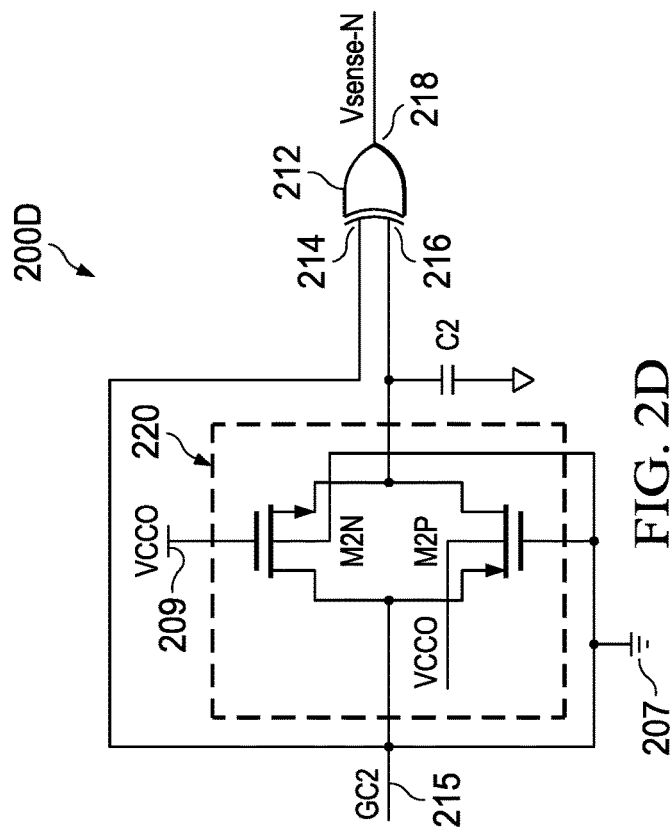
FIG. 2B illustrates a process-sensing circuit according to an embodiment of the disclosure.
Figure 2D:
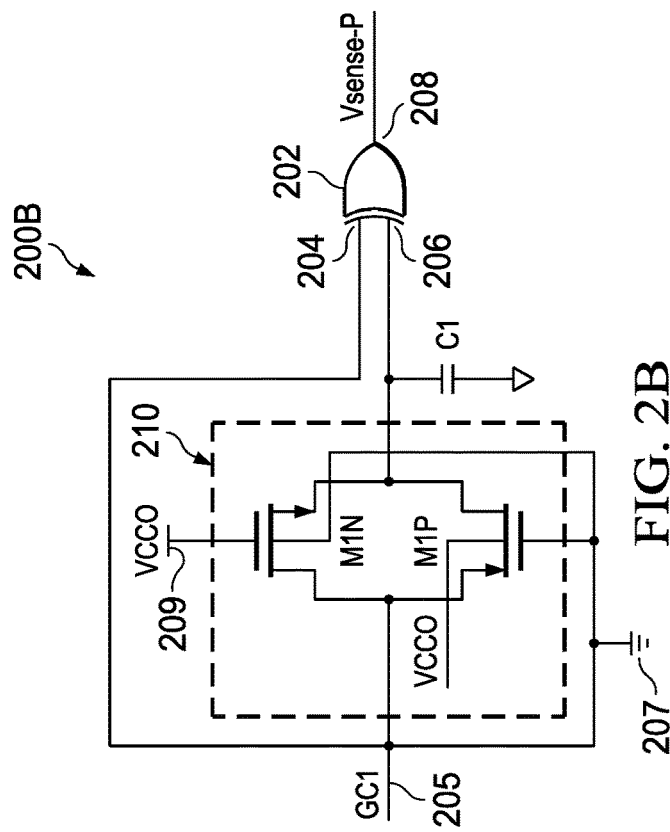
FIG. 2D illustrates a process-sensing circuit according to an embodiment of the disclosure.

Before turning to the operation of output buffer circuit 100, FIG. 2A and FIG. 2B provide two versions of a first process-sensing circuit that can be utilized as the first process-sensing circuit 113 in FIG. 1 to provide the first process-sensing signal Vsense-P, while FIG. 2C and FIG. 2D provide two versions of a second process-sensing circuit that can be used as the second process-sensing circuit 115 to provide the second process-sensing signal Vsense-N.

In FIG. 2A, a first process-sensing circuit 200A includes an XOR gate 202, which has a first XOR input 204, a second XOR input 206, and an XOR output 208. The first XOR input 204 is coupled directly to a first gate control signal lead 205 and the second XOR input 206 is coupled to the first gate control signal lead 205 through an RC circuit, which in the embodiment shown includes a first capacitor C1 and a first resistive element 210, e.g., a first sense resistor R1. The first resistive element 210 has a first resistive terminal and a second resistive terminal; the first resistive terminal is coupled to the first gate control signal lead 205 and the second resistive terminal is coupled to the second XOR input 206. The first capacitor C1 has a first capacitive terminal and a second capacitive terminal. The first capacitive terminal is coupled between the second resistive terminal and the second XOR input 206; the second capacitive terminal is coupled to a ground lead. The XOR output 208 is coupled to the first process-sensing signal lead 112 of output buffer circuit 100.

During operation of the first process-sensing circuit 200A, when the input on the first XOR input 204 and the second XOR input 206 are the same, the XOR output 218 is low; when the first gate control signal GC1 changes, e.g., to a high signal, the high signal is received immediately at the first XOR input 204, while the high signal on the second XOR input 206 is delayed due to the RC circuit of the first sense resistor R1 and the first capacitor C1. During the period while the values on the first XOR input 204 and the second XOR input 206 are unequal, the XOR output 218 is high, providing a monoshot pulse that can be used to turn on the gates of the first group of bypass FETs MN1B, MN2B . . . MNZB. When the first gate control signal GC1 changes to a low signal, the pulse will be repeated, although staggering in the first group of stagger FETs MP1, MP2 . . . MPZ will not be active at that time and the pulse has no effect on operation of the output buffer circuit 100.

Similarly, FIG. 2C depicts a second process-sensing circuit 200C that includes an XNOR gate 212, which has a first XNOR input 214, a second XNOR input 216, and an XNOR output 218. The first XNOR input 214 is coupled directly to a second gate control signal lead 215 and the second XNOR input 216 is coupled to the second gate control signal lead 215 through the RC circuit that includes a second capacitor C2 and a second resistive element 220, which in one embodiment is a second sense resistor R2. The second sense resistor R2 has a third resistive terminal and a fourth resistive terminal; the third resistive terminal is coupled to the second gate control signal lead 215 and the fourth resistive terminal is coupled to the second XNOR input 216. The second capacitor C2 has a third capacitive terminal and a fourth capacitive terminal. The third capacitive terminal is coupled between the fourth resistive terminal and the second XNOR input 216; the fourth capacitive terminal is coupled to the ground lead. The XNOR output 218 is coupled to the second process-sensing signal lead 114 of output buffer circuit 100.

During operation of the second process-sensing circuit 200C, when the input on the first XNOR input 214 and the second XNOR input are the same, the XNOR output 218 is high; when the second gate control signal GC2 changes, e.g., to a high signal, the high signal is received immediately at the first XNOR input 214, while the high signal on the second XNOR input 216 is again delayed due to the RC circuit of the second sense resistor R2 and the second capacitor C2. During the period while the values on the first XNOR input 214 and the second XNOR input 216 are unequal, the XNOR output 218 is low, providing a negative monoshot pulse that can be used to turn on the gates of the second group of bypass FETs MP1B, MP2B MPZB. When the second gate control signal GC2 changes to a low signal, the negative pulse will be repeated, although staggering in the second group of stagger FETs MN1, MN2 . . . MNZ will not be active at that time and the pulse has no effect on operation of the output buffer circuit 100.

Figure 3A:
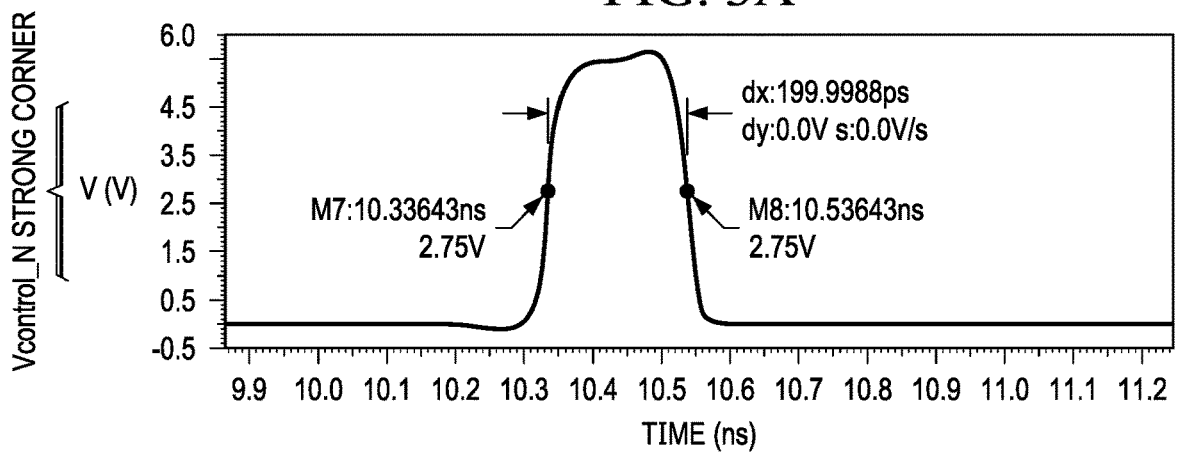
FIG. 3A depicts a signal produced by the circuit of FIG. 2A when the circuit is produced in the strong process corner according to an embodiment of the disclosure.
Figure 3B:
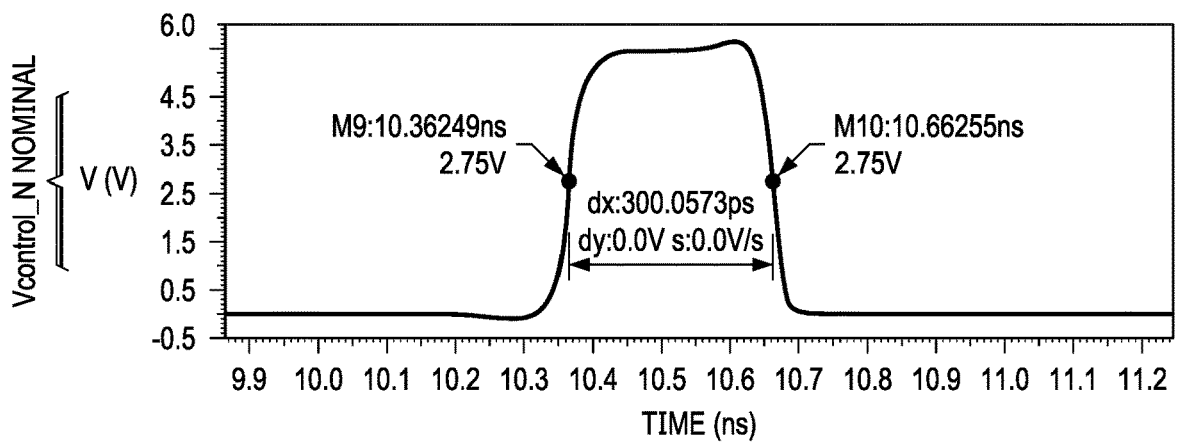
FIG. 3B depicts a signal produced by the circuit of FIG. 2A when the circuit is produced in the nominal process corner according to an embodiment of the disclosure.
Figure 3C:
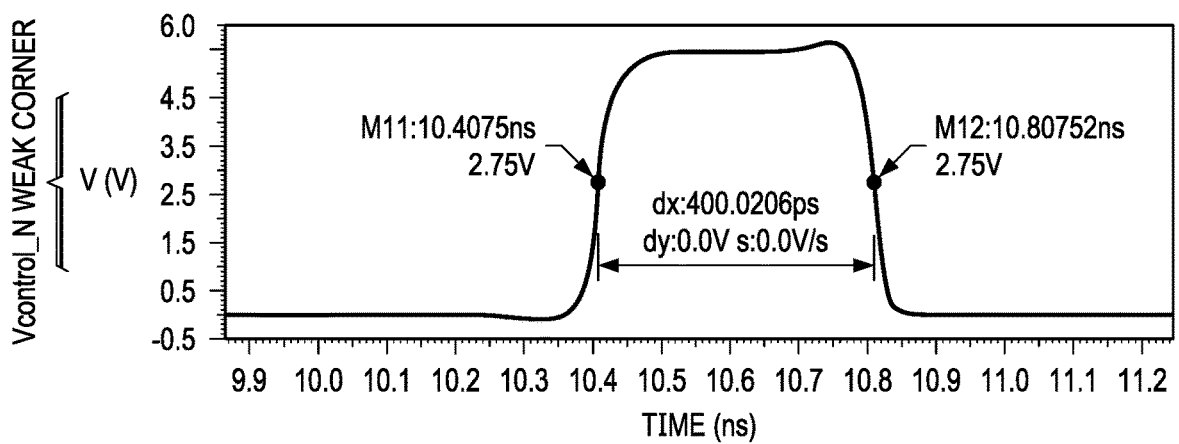
FIG. 3C depicts a signal produced by the circuit of FIG. 2A when the circuit is produced in the weak process corner according to an embodiment of the disclosure.

FIG. 3A through FIG. 3C each illustrate a monoshot pulse created by the first process-sensing circuit 200A using the first gate control signal GC1 as an input and providing the first process-sensing signal Vsense-P on the XOR output 208. FIG. 3A depicts a pulse created in a strong process corner of the process and having a width, measured while the pulse is at a voltage of 2.5 V or greater, of about 200.0 picoseconds (ps). In FIG. 3B, the pulse is created in a nominal corner of the process and has a width of about 300.1 ps. In FIG. 3C, the pulse is created in a weak process corner of the process and has a width of about 400.0 ps. It can be seen that within this specific process, the width of the pulse varies by about 200 ps as testing moves from the strong process corner to the weak process corner. This variability can be used to vary the stagger resistance provided to the stagger FETs in FIG. 1 and thus the speed of turn-on of the stagger FETs. Corresponding results can be expected using the second process-sensing circuit 200C with the second gate control signal GC2 as an input and providing the second process-sensing signal Vsense-N on the XNOR output 218.

The first process-sensing circuit 200A and the second process-sensing circuit 200C are sensitive to variations in the process, but do not provide sensitivity to changes in voltage. In FIG. 2B, an alternate implementation of a first process-sensing circuit 200B includes the XOR gate 202 and the first capacitor C1, but the first resistive element 210 is now a first MOSFET switch, which includes a first NFET M1N and a first PFET M1P. The first NFET M1N has a first NFET source, a first NFET drain, and a first NFET gate, and the first PFET M1P has a first PFET source, a first PFET drain, and a first PFET gate. The first NFET drain and the first PFET source are coupled to each other to form the first resistive terminal and are also coupled to the first gate control signal lead 205. The first NFET source and the first PFET drain are coupled to each other and form the second resistive terminal and are also coupled to the second XOR input 206. The first NFET gate is coupled to the output domain power lead 209 and the first PFET gate is coupled to the ground lead 207. Using the first MOSFET switch will provide greater sensitivity to voltage for the first process-sensing signal Vsense-P.

FIG. 2D depicts an alternate implementation of a second process-sensing circuit 200D that can be used to provide the second process-sensing signal Vsense-N. The second process-sensing circuit 200D includes the XNOR gate 212 and the second capacitor C2, as well as the second MOSFET switch, which includes the second NFET M2N and the second PFET M2P as second resistive element 220. The first resistive terminal is coupled to the second gate control signal lead 215 and the second resistive terminal is coupled to the second XNOR input 216. The second NFET gate is coupled to the output domain power lead 209 and the second PFET gate is coupled to the ground lead 207. The second MOSFET switch provides greater sensitivity to voltage for the second process-sensing signal Vsense-N.

The following tables depict the variability of monoshot pulse widths across differences in output voltage, process, and temperature using either a MOSFET switch or a resistor as the resistive element in the process-sensing circuit 200. Table 1 depicts variations due to voltage differences:

TABLE 1

| Voltage | 5.5 | 3.3 | 1.65 | 1.1 | Variation |
|---|---|---|---|---|---|
| Resistor | 183 p | 208 p | NO | NO | No change |
| MOSFET | 179 p | 361 p | 1.714 n | 6.93 n | Inversely proportional to (Vdd−Vt) |

When the resistor is used, the monoshot pulse had a width of 183 ps at 5.5 V, a width of 179 ps at 3.3 V, and no response at 1.65 V and at 1.1 V, providing substantially no change across this voltage range. However, when the MOSFET switch was used, the monoshot pulse width ranged from 179 ps at 5.5 V to 6.93 ns at 1.1 V. The variation across voltages was inversely proportional to the difference between the output operating voltage and the threshold voltage for the MOSFETs (Vdd−Vt).

Table 2 provides the results across the process corners:

TABLE 2

| Corner | Strong | Nominal | Weak | Variation |
|---|---|---|---|---|
| Resistor | 72 p | 183 p | 302 p | +/−65% |
| MOSFET | 110 p | 179 p | 287 p | +/−60% |

Using the resistor, a monoshot pulse had a width of 72 ps in the strong process corner, 183 ps in the nominal corner, and 302 ps in the weak process corner. Using the MOSFET switch, a monoshot pulse had a width of 110 ps in the strong process corner, 179 ps in the nominal corner, and 287 in the weak process corner. For both embodiments, the process-sensing circuit 200 provided variation in the pulse of between +/−60-65%, with the use of the resistor providing a somewhat larger variation.

Although process-sensing circuit 200 is not specifically designed to sense temperature, resistors in the circuits are selected to have a negative temperature coefficient. Table 3 provides the monoshot width variation across temperature:

TABLE 3

| Temp. | −55 C. | −40 C. | 25 C. | 85 C. | 125 C. | 150 C. | Variation |
|---|---|---|---|---|---|---|---|
| Resistor | 153.5 | 158.9 | 182.9 | 205.6 | 221.5 | 232.1 | 37% |
| MOSFET | 136.2 | 144.5 | 179.1 | 209.2 | 228.1 | 239.4 | 53% |

Using the resistor, the monoshot width ranged from about 153.5 ps at −55° C. to about 232.1 ps at 150° C., a variation of about 37%; using the MOSFET switch as the resistive element, the monoshot width ranged from about 136.2 ps at −55° C. to about 239.4 ps at 150° C., a variation of about 53%. As seen in the above tables, both the first process-sensing circuit 200A and the second process-sensing circuit 200C can be used to provide variations across process, the first process-sensing circuit 200B and the second process-sensing circuit 200D also provide variations across voltage.

With the differences provided by the process-sensing circuit 200 in mind, we turn to the operation of the staggering FETs in the output buffer circuit 100. During operation of the output buffer circuit 100, when the first gate control signal GC1 goes high, the high signal is passed in turn to the gates of each of the first group of stagger FETs MP1, MP2 . . . MPZ, with an attendant delay between turn-on of each of the first group of stagger FETs MP1, MP2 . . . MPZ caused by the presence of the respective first base resistors RP1A, RP2A . . . RPZA and the respective first adjustable resistors RP1B, RP2B . . . RPZB. A minimum required amount of delay can be provided by the first base resistors RP1A, RP2A . . . RPZA. The additional amount of resistance provided by the first adjustable resistors RP1B, RP2B, RPZB can be modified by using the first process-sensing signal Vsense-P to turn the first group of bypass FETs MN1B, MN2B . . . MNZB on or off. It has been demonstrated that the first process-sensing signal Vsense-P can provide a longer high signal when the chip is in the weak process corner of the process or at low voltages than when the chip is in the strong process corner of the process or at high voltages.

At the same time, a high signal on the first process-sensing signal Vsense-P turns on the first group of bypass FETs MN1B, MN2B MNZB, the resistance of the corresponding first adjustable resistors RP1B, RP2B . . . RPZB is bypassed for the time that the first process-sensing signal Vsense-P is above the turn-on voltage of the first group of bypass FETs MN1B, MN2B . . . MNZB. In the examples of FIGS. 3A, 3B, and 3C, the time that the adjustable resistance would be bypassed varied from about 200 ps in the strong process corner to about 400 ps in the weak process corner. By adjusting the amount of resistance that is provided or bypassed, the speed of the chip in the weak process corner and/or at low voltages can be improved without increasing the noise in the strong process corner or at high voltages. When the first gate control signal GC1 goes low, the first inverse gate control signal /GC1 goes high, turning on each of the group of pull-up FETs MP1P, MP2P . . . MPZP to quickly turn off each of the first group of stagger FETs MP1, MP2 . . . MPZ.

At the same time that the response of the first group of stagger FETs MP1, MP2 . . . MPZ is modified by the action of the first group of bypass FETs MN1B, MN2B . . . MNZB, the addition of the first boost FET MPA in series with the second boost FET MPB pulls up on the output signal lead 110 for a variable amount of time that depends on the width of the pulse. The first boost FET MPA, which in this implementation is a PFET, is controlled by the inverse of the first processing-sensing signal Vsense-P so that in the strong process corner, the first boost FET MPA pulls up on the output signal lead OUT for a shorter amount of time and in the weak process corner, the first boost FET MPA pulls up on the output signal lead OUT for a longer amount of time.

Likewise, when the second gate control signal GC2 goes high, the high signal is passed in turn to the gates of each of the second group of stagger FETs MN1, MN2 . . . MNZ, with an attendant delay between turn-on of each of the second group of stagger FETs MN1, MN2 . . . MNZ caused by the respective second base resistors RN1A, RN2A . . . RNZA and the respective second adjustable resistors RN1B, RN2B . . . RNZB. A minimum required amount of delay can again be provided by the second base resistors RN1A, RN2A . . . RNZA, while an additional amount of resistance can be adjustably provided by the second adjustable resistors RN1B, RN2B . . . RNZB through the action of the second group of bypass FETs MP1B, MP2B . . . MPZB so that the resistance of the respective second adjustable resistors RN1B, RN2B . . . RNZB is selectively bypassed. By adjusting the amount of resistance that is provided or bypassed by the second adjustable resistors RN1B, RN2B . . . RNZB, the speed of the chip in the weak process corner can be improved without increasing noise in the strong process corner. When the second gate control signal GC2 goes low, the second inverse gate control signal /GC2 goes high, turning on each of the group of pull-down FETs MN1P, MN2P . . . MNZP to quickly turn off each of the second group of stagger FETs MN1, MN2 . . . MNZ.

At the same time that the response of the second group of stagger FETs MN1, MN2 . . . MNZ is modified by the action of the second group of bypass FETs MP1B, MP2B . . . MPZB, the addition of the fourth boost FET MND in series with the third boost FET MNC pulls down on the output signal lead 110 for a variable amount of time to boost the output signal VOUT. The fourth boost FET MND, which in this implementation is an NFET, is controlled by an inverse of the second process-sensing signal Vsense-N so that in the strong process corner, the fourth boost FET MND pulls the output signal lead 110 down for a shorter amount of time and in the weak process corner, the fourth boost FET MND pulls the output signal lead 110 down for a longer amount of time to boost the output signal VOUT.

The following tables provide output rise times across each of process, voltage, and temperature (PVT) and compare the values without process sensing and the values achieved with process sensing. Table 4 shows the output rise time across corners of the process at 5V and −40° C. and the percentage variation from the nominal corner:

TABLE 4

| Process | Strong | Nominal | Weak | % Variation from Nom. |
|---|---|---|---|---|
| No sensing | 1.713 n | 2.305 n | 2.813 n | +/−26% |
| Sensing | 1.818 n | 1.804 n | 1.78 n | +/−1.34% |

When process sensing is not present, the rise time varied from about 1.713 ns at the strong process corner to about 2.813 ns at the weak process corner, providing a +/−26% variation from the nominal corner at 2.305 ns. When process sensing was provided, the rise time varied from about 1.818 ns to about 1.78 ns, a variation of +1-1.34% from the nominal corner of 1.804 ns. Table 5 depicts the output rise time across temperature at the nominal corner:

TABLE 5

| Process | −40 C. | −25 C. | 0 C. | 25 C. | 50 C. | 75 C. | 100 C. | 125 C. | % Vary |
|---|---|---|---|---|---|---|---|---|---|
| No sensing | 2.305 | 2.324 | 2.351 | 2.375 | 2.395 | 2.414 | 2.428 | 2.436 | +/−5.5% |
| Sensing | 1.713 | 1.771 | 1.8 | 1.81 | 1.822 | 1.825 | 1.831 | 1.837 | +/−7% |

With no process sensing present, the rise time varied from about 2.305 ns at −40° C. to about 2.436 ns at 125° C., a variation of +/−5.5%. When process sensing was provided, the rise time varied from about 1.713 ns to about 1.837 ns, a variation of +/−7%. The process-sensing circuit has little effect on temperature variations. Finally, Table 6 below depicts the output rise time across voltage at the weak process corner and at 125° C.:

TABLE 6

| Process | 5 V | 4 V | 3 V | % Variation |
|---|---|---|---|---|
| Sensing | 2 | 2.1 | 2.374 | 18.4% |
| No sensing | 2.84 | 3.046 | 3.711 | 30% |

As shown above, when using process sensing, the variation between 2 ns at 5 V and 2.374 ns at 3 V provided a percentage variation of 18.4%, while operating without the use of the process-sensing circuit provided a 30% variation between a rise time of 2.84 ns at 5 V and 3.711 ns at 3 V. The effect of the process-sensing circuit can also be shown across the combined variations in voltage and process. Table 7 provides rise and fall times for five output voltages and across the process, showing minimum and maximum values.

TABLE 7

| No PVT Sensing | | |
|---|---|---|
| Output | Min | Max |
| VCCO = 5 V | | |
| Fall Time | 1.43 n | 2.441 n |
| Rise Time | 1.713 n | 2.864 n |
| VCCO = 4 V | | |
| Fall Time | 1.664 n | 2.708 n |
| Rise Time | 1.956 n | 3.058 n |
| VCCO = 3 V | | |
| Fall Time | 1.98 n | 3.068 n |
| Rise Time | 2.315 n | 3.706 n |
| VCCO = 2 V | | |
| Fall Time | 2.331 n | 4.283 n |
| Rise Time | 2.752 n | 5.158 n |
| VCCO = 1.1 V | | |
| Fall Time | 5.218 n | 30.55 n |
| Rise Time | 5.924 n | 21.44 n |

Table 8 provides rise and fall times for the same five output voltages and across the process, showing minimum and maximum values. Table 8 also shows the width of both the PMOS monoshot and the NMOS monoshot.

TABLE 8

| With PVT Sensing | | |
|---|---|---|
| Output | Min | Max |
| VCCO = 5 V | | |
| Fall Time | 1.9 n | 1.943 n |
| Rise Time | 2.019 n | 2.256 n |
| Monoshot PMOS | 202.8 p | 315.2 p |
| Monoshot NMOS | 239 p | 389.7 p |
| VCCO = 4 V | | |
| Fall Time | 2.225 n | 2.28 n |
| Rise Time | 2.084 n | 2.297 n |
| Monoshot PMOS | 232.4 p | 372.1 p |
| Monoshot NMOS | 355.8 p | 548.9 p |
| VCCO = 3 V | | |
| Fall Time | 2.647 n | 2.851 n |
| Rise Time | 2.239 n | 2.429 n |
| Monoshot PMOS | 279.3 p | 509.4 p |
| Monoshot NMOS | 599.4 p | 910 p |
| VCCO = 2 V | | |
| Fall Time | 3.549 n | 3.859 n |
| Rise Time | 2.382 n | 3.069 n |
| Monoshot PMOS | 427.3 p | 1.149 n |
| Monoshot NMOS | 1.471 n | 2.308 n |
| VCCO = 1.1 V | | |
| Fall Time | 8.017 n | 28.85 n |
| Rise Time | 7.598 n | 20.5 n |
| Monoshot PMOS | 4.164 n | 27.58 n |
| Monoshot NMOS | 7.841 n | 32.63 n |

The maximum improvement across PVT is 20%

Figure 4:
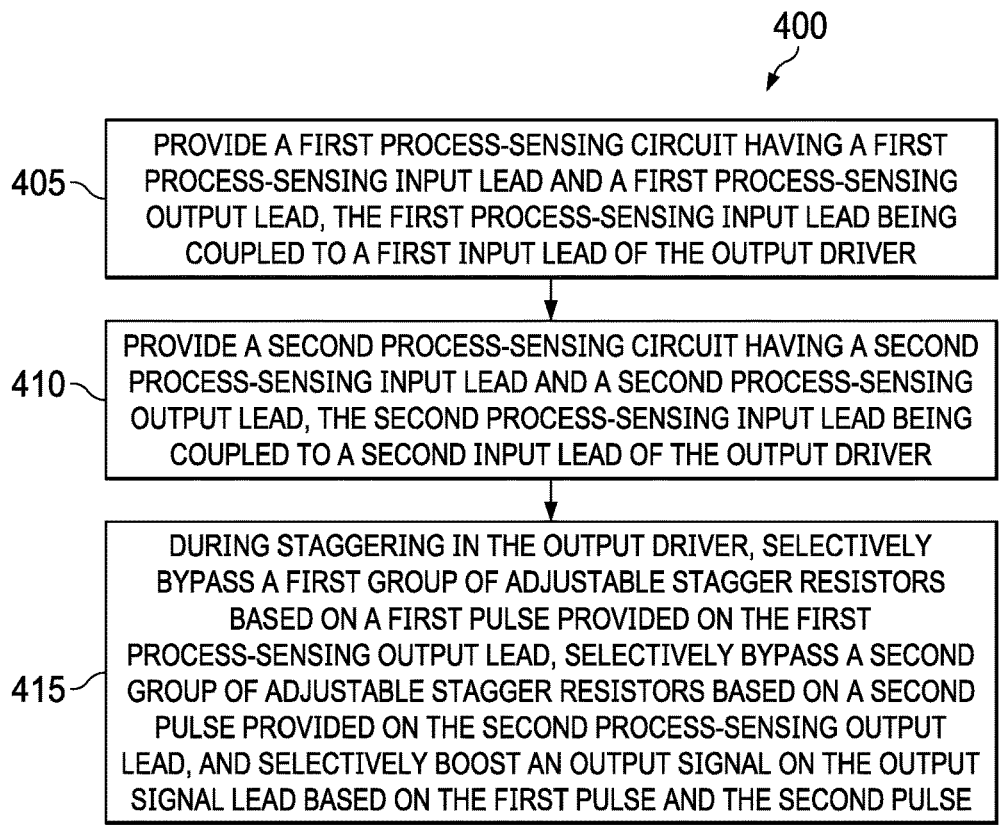
FIG. 4 depicts a method of performing staggering in an output buffer according to an embodiment of the disclosure.

FIG. 4 depicts a flowchart for a method 400 of performing staggering in an output driver. The method 400 begins with providing 405 a first process-sensing circuit having a first process-sensing input lead and a first process-sensing output lead, the first process-sensing input lead being coupled to a first input lead of the output driver. The method 400 also provides 410 a second process-sensing circuit having a second process-sensing input lead and a second process-sensing output lead, the second process-sensing input lead being coupled to a second input lead of the output driver. During staggering in the output driver, a first group of adjustable stagger resistors is selectively bypassed 415 based on a first pulse provided at the first process-sensing output lead and a second group of adjustable stagger resistors is selectively bypassed based on a second pulse provided at the second process-sensing output lead, and an output signal on the output signal lead is selectively boosted based on the first pulse and the second pulse.

Figure 4A:
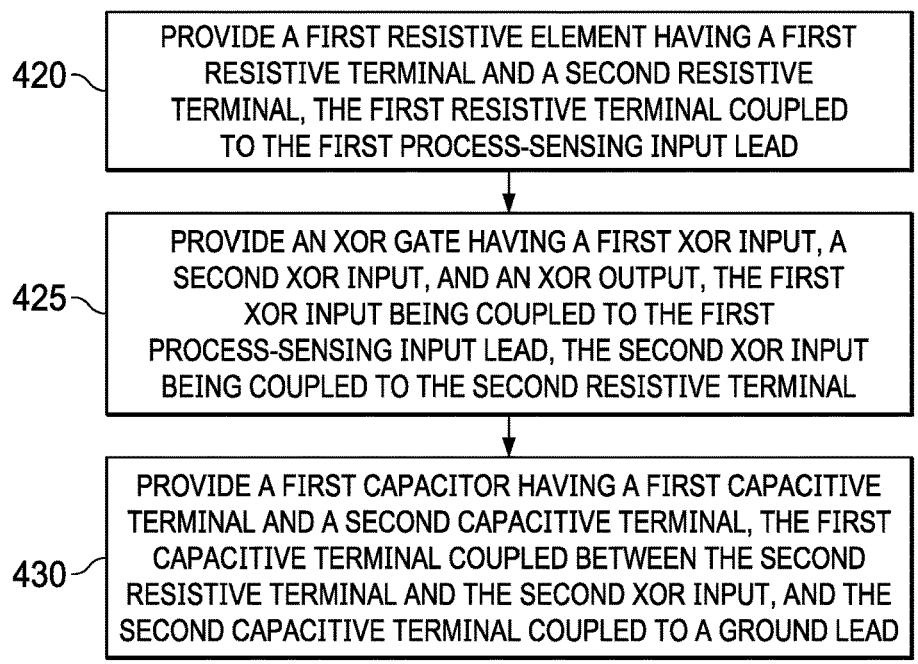

Each of FIG. 4A through FIG. 4F provide either additional elements that may be part of the method 400 or else additional details regarding existing elements of the method 400. FIG. 4A depicts details of providing the first process-sensing circuit. A first resistive element having a first resistive terminal and a second resistive terminal is provided 420 and the first resistive terminal is coupled to the first process-sensing input lead. An XOR gate having a first XOR input, a second XOR input, and an XOR output are also provided 425. The first XOR input is coupled to the first process-sensing input lead and the second XOR input is coupled to the second resistive terminal. Finally, a first capacitor having a first capacitive terminal and a second capacitive terminal is provided 430; the first capacitive terminal is coupled between the second resistive terminal and the second XOR input; the second capacitive terminal is coupled to a ground lead.

In one implementation shown in FIG. 4B, providing the first resistive element includes providing 435 a first resistor. In one implementation shown in FIG. 4C, providing the first resistive element includes providing 440 a first NFET and a first PFET. A drain of the first NFET is coupled to a source of the first PFET and to the first resistive terminal; and a source of the first NFET is coupled to a drain of the first PFET and to the second resistive terminal. A gate of the first NFET is coupled to an output domain power lead; and a gate of the first PFET is coupled to the ground lead.

FIG. 4D depicts details of providing the second process-sensing circuit. A second resistive element having a third resistive terminal and a fourth resistive terminal is provided 445; the third resistive terminal is coupled to the second process-sensing input lead. An XNOR gate having a first XNOR input, a second XNOR input, and an XNOR output are also provided 450. The first XNOR input is coupled to the second process-sensing input lead and the second XNOR input is coupled to the fourth resistive terminal. Finally, a second capacitor having a third capacitive terminal and a fourth capacitive terminal is provided 455; the third capacitive terminal is coupled between the fourth resistive terminal and the second XNOR input; and the fourth capacitive terminal is coupled to a ground lead.

In one implementation shown in FIG. 4E, providing the second resistive element includes providing 460 a second sense resistor. In one implementation shown in FIG. 4F, providing the second resistive element includes providing 465 a second NFET and a second PFET. A drain of the second NFET is coupled to a source of the second PFET and to the third resistive terminal; and a source of the second NFET is coupled to a drain of the second PFET and to the fourth resistive terminal. A gate of the second NFET is coupled to the output domain power lead; and a gate of the second PFET is coupled to the ground lead.

FIG. 4G provides further details regarding selectively boosting the output signal. A first boost FET is coupled 470 in series with a second boost FET between the output domain power lead and the output signal lead, with the second boost FET having a gate coupled to the first gate control signal lead. A third boost FET is coupled 475 in series with a fourth boost FET between the output signal lead and the ground lead, the third boost FET having a gate coupled to the second gate control signal lead. The first boost FET is controlled 480 using an inverted version of the first pulse and the fourth boost FET is controlled 485 using an inverted version of the second pulse.

Figure 5A:
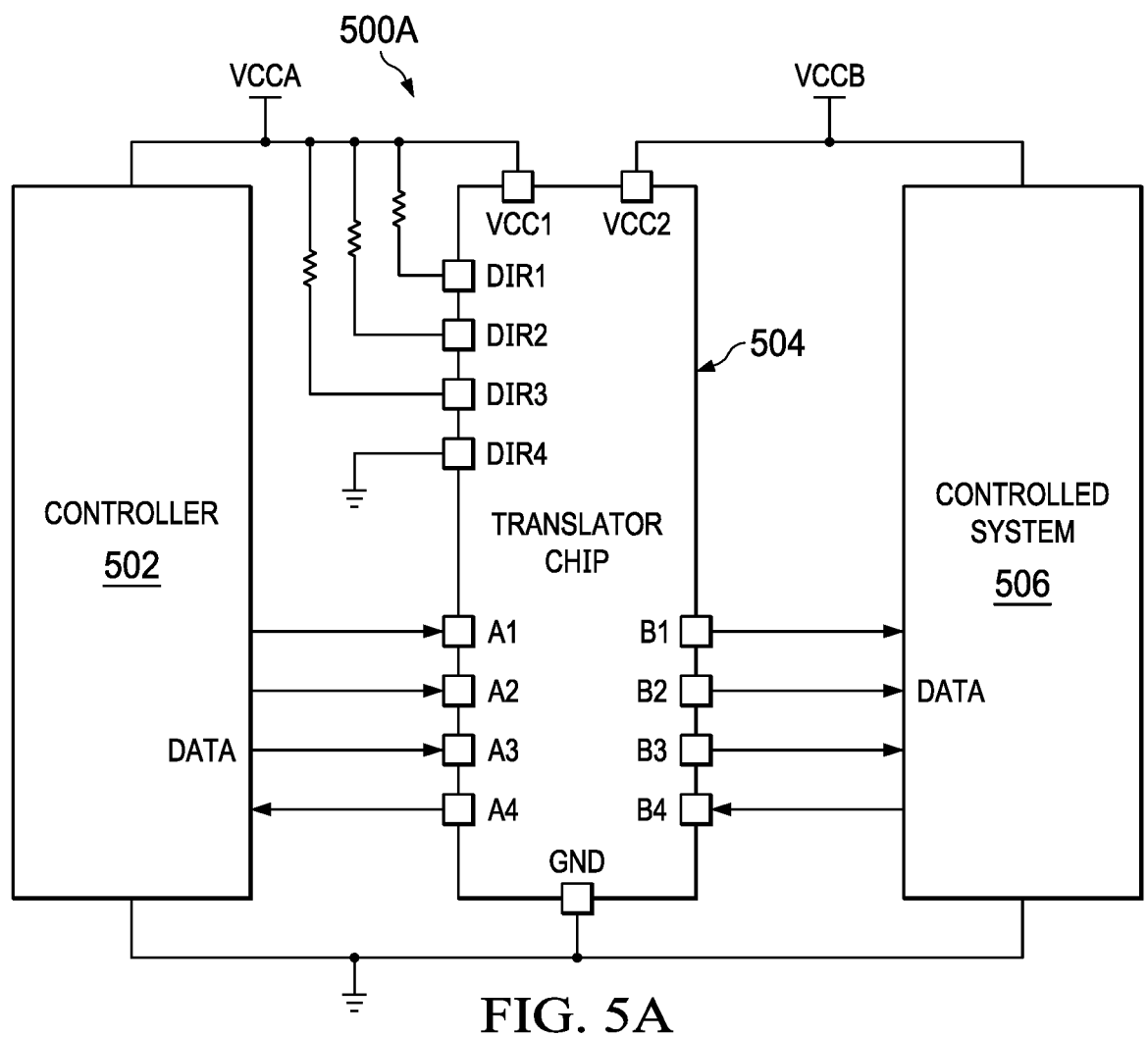
FIG. 5A depicts a block diagram of a system that includes a voltage level translator chip that can incorporate an output buffer according to an embodiment of the disclosure.

The disclosed output buffer with process-controlled staggering can be widely implemented in IC chips that use staggering in an output buffer. FIG. 5A depicts a block diagram of a system 500A in which the disclosed output buffer with process-controlled staggering can be implemented as part of a voltage level translator chip 504, which is coupled between a controller chip 502 and a controlled system chip 506. The controller chip 502 and the controlled system chip 506 may have been designed at different times in the evolution of IC chips and thus operate at different voltages. In the implementation shown, controller chip 502 utilizes supply voltage VCCA and controlled system chip 506 utilizes supply voltage VCCB, each of which can be, e.g., between 0.65 volts and 3.6 volts. In order for the controller chip 502 and the controlled system chip 506 to communicate with each other, the voltage level translator chip 504 performs translation of signals between the controller chip 502 and the controlled system chip 506.

The voltage level translator chip 504 includes the following pins: first voltage supply pin VCC1, second voltage supply pin VCC2, ground pin GND, first direction pin DIR1, second direction pin DIR2, third direction pin DIR3, fourth direction pin DIR4, first A data pin A1, second A data pin A2, third A data pin A3, fourth A data pin A4, first B data pin B1, second B data pin B2, third B data pin B3, and fourth B data pin B4.

As shown in FIG. 5A, first voltage supply pin VCC1 is coupled to supply voltage VCCA, second voltage supply pin VCC2 is coupled to supply voltage VCCB, and ground pin GND is coupled to a ground plane. Each of the A data pins forms a channel with a respective B data pin, e.g., a first channel is formed by first A data pin A1 and first B data pin B2; a second channel is formed by second A data pin A2 and second B data pin B2; a third channel is formed by third A data pin A3 and third B data pin B3; and a fourth channel is formed by fourth A data pin A4 and fourth B data pin B4. The translation can be provided in either direction, i.e., from an A data pin to a B data pin or from a B data pin to an A data pin, depending on how the first direction pin DIR1, the second direction pin DIR2, the third direction pin DIR3, and the fourth direction pin DIR4 are coupled. In one embodiment, by coupling the first direction pin DIR1, the second direction pin DIR2, and the third direction pin DIR3 to supply voltage VCCA, the first channel, the second channel and the third channel translate signals from the controller chip 502 to the controlled system chip 506; and by coupling the fourth direction pin DIR4 to the ground pin GND, the fourth channel translates signals from the controlled system chip 506 to the controller chip 502.

Figure 5B:
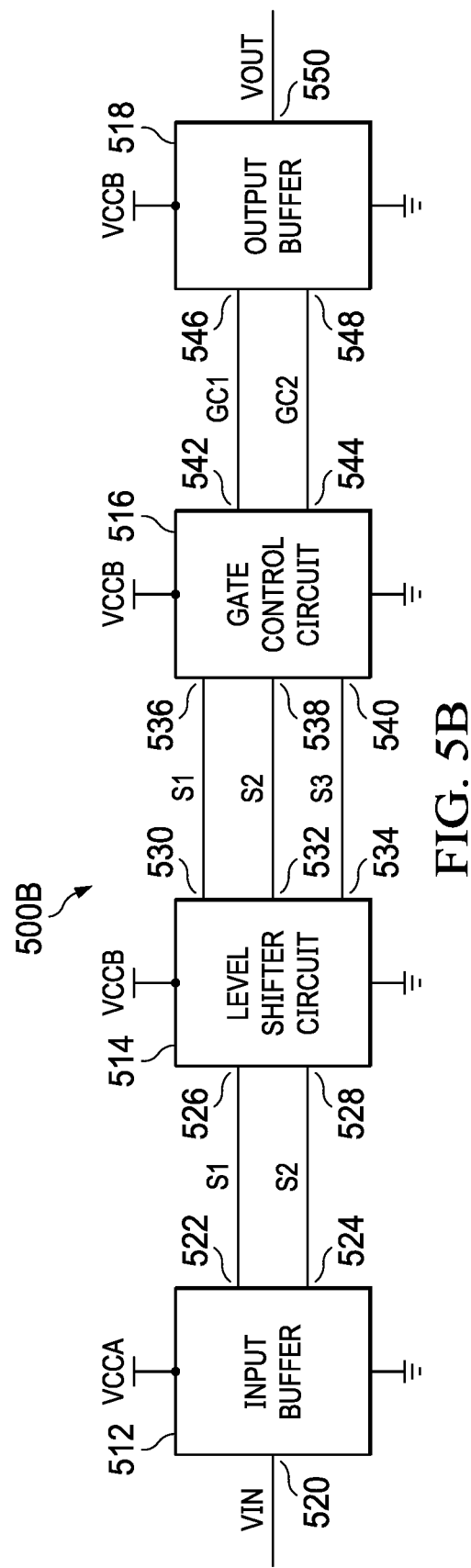
FIG. 5B depicts a simplified block diagram of a portion of a voltage level translator channel that can incorporate an output buffer according to an embodiment of the disclosure.

FIG. 5B depicts a block diagram of a portion of a voltage level translator channel 500B, which can be utilized to translate a signal operating at supply voltage VCCA to a signal operating at supply voltage VCCB. The voltage level translator channel 500B can be part of a voltage level translator chip such as the voltage level translator chip 504. In one implementation, the voltage level translator channel 500B will also contain a portion (not specifically shown) that is configured to translate a signal operating at supply voltage VCCB to a signal operating at supply voltage VCCA, with appropriate circuitry to select which of the two portions is active in the system. The portion of the voltage level translator channel 500B shown includes an input buffer 512, a level shifter circuit 514, a gate control circuit 516, and an output buffer 518.

The input buffer 512 has an IB-input node 520, a first IB-output node 522, a second IB-output node 524, and is the only module in the voltage level translator channel 500B operable to be coupled between a first supply voltage, e.g., supply voltage VCCA, and a ground plane. Level shifter circuit 514 has a first LS-input node 526, a second LS-input node 528, a first LS-output node 530, a second LS-output node 532, and a third LS-output node 534. The first LS-input node 526 is coupled to the first IB-output node 522 and the second LS-input node 528 is coupled to the second IB-output node 524.

The gate control circuit 516 has a first GC-input node 536, a second GC input node 538, a third GC-input node 540, a first GC-output node 542, and a second GC-output node 544. The first GC-input node 536 is coupled to the first LS-output node 530, the second GC-input node 538 is coupled to the second LS-output node 532, and the third GC-input node 540 is coupled to the third LS-output node 534. The output buffer 518 has a first OB-input node 546, a second OB-input node 548, and an OB-output node 550. The first OB-input node 546 is coupled to the first GC-output node 542, the second OB-input node 548 is coupled to the second GC-output node 544, and the OB-output node 550 is coupled to provide an output signal VOUT. Each of the level shifter circuit 514, the gate control circuit 516, and the output buffer 518 are operable to be coupled between a second supply voltage, e.g., supply voltage VCCB, and the ground plane.

During operation of the voltage level translator channel 500B, the input buffer 512 receives an input signal VIN, which operates between supply voltage VCCA and the ground plane, on the IB-input node 520 and provides a first intermediate signal S1 on the first IB-output node 522 and a second intermediate signal S2 on the second IB-output node 524. The level shifter circuit 514 receives the first intermediate signal S1 on the first LS-input node 526 and the second intermediate signal S2 on the second LS-input node 528; the first intermediate signal S1 and the second intermediate signal S2 are used to create a third intermediate signal S3. The first intermediate signal S1 is then provided on the first LS-output node 530, the second intermediate signal S2 is provided on the second LS-output node 532, and the third intermediate signal S3 is provided on the third LS-output node 534.

The gate control circuit 516 receives the first intermediate signal S1 on the first GC-input node 536, the second intermediate signal S2 on the second GC-input node 538, and the third intermediate signal S3 on the third GC-input node 540 and provides the first gate control signal GC1 on the first GC-output node 542 and the second gate control signal GC2 on the second GC-output node 544. The output buffer 518, which may be an implementation of the output buffer circuit 100, receives the first gate control signal GC1 on the first OB-input node 546 and the second gate control signal GC2 on the second OB-input node 548 and provides the output signal VOUT, which operates between supply voltage VCCB and the ground plane, on the OB-output node 550. By implementing process-controlled staggering in the output buffer 518, the speed of the voltage level translator channel 500B is improved while providing good noise performance across the process.

Applicants have disclosed both an output buffer and a system that includes process-controlled staggering, as well as a method of providing staggering in an output buffer. No additional pins are necessary to implement the process-controlled staggering and no additional current is necessary. The additional circuits are low-area circuits and do not greatly increase the real estate on the chip. In one implementation, staggered resistance was controlled using a process controlled MOS switch in a process-sensing circuit. The process-sensing circuit may provide one or more of the following benefits: improved time propagation delay (TPD), improvements in rise times and fall times of the output buffer circuit, and an improved data rate across process, voltage, and temperature. The process-controlled staggering improves the speed of the output buffer circuit in the weak process corner, without impacting the noise performance at the strong process corner. By maintaining good noise control through staggering at higher voltages and strong process corners, the output signals remain monotonic.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. An electronic device comprising:
    a first group of stagger field effect transistors (FETs) coupled in parallel between an output domain power lead and an output signal lead, a gate of each of the first group of stagger FETs being coupled to a respective first base resistor and a respective first adjustable resistor, the respective first base resistors and the respective first adjustable resistors being coupled in series and coupled to a first gate control signal lead;
    a first group of bypass FETs, each of the first group of bypass FETs being coupled across the terminals of the respective first adjustable resistor, a gate of each of the first group of bypass FETs being coupled to a first process-sensing signal lead;
    a second group of stagger FETs coupled in parallel between the output signal lead and a ground lead, a gate of each of the second group of stagger FETs being coupled to a respective second base resistor and a respective second adjustable resistor, the respective second base resistors and the respective second adjustable resistors being coupled in series and coupled to a second gate control signal lead; and
    a second group of bypass FETs, each of the second group of bypass FETs being coupled across the terminals of the respective second adjustable resistor, a gate of each of the second group of bypass FETs being coupled to a second process-sensing signal lead.

2. The electronic device (output buffer) as recited in claim 1 including:
    a group of pull-up FETs coupled between the output domain power lead and a gate of a respective one of the first group of stagger FETs, a gate of each of the group of pull-up FETs being coupled to a first inverse gate control signal lead; and
    a group of pull-down FETs coupled between the gate of a respective one of the second group of stagger FETs and the ground lead, a gate of each of the group of pull-down FETs being coupled to a second inverse gate control signal lead.

3. The electronic device as recited in claim 2 including:
    a first boost FET coupled in series with a second boost FET between the output domain power lead and the output signal lead; and
    a third boost FET, and a fourth boost FET coupled in series between the output signal lead and the ground lead,
    the first boost FET having a gate coupled to an inverse of the first process-sensing signal lead, the second boost FET having a gate coupled to the first gate control signal lead, the third boost FET having a gate coupled to the second gate control signal lead, and the fourth boost FET having a gate coupled to an inverse of the second process-sensing signal lead.

4. The electronic device as recited in claim 3 in which:
the first group of stagger FETs, the group of pull-up FETs, the second group of bypass FETs the first boost FET, and the second boost FET are P type FETs (PFETs); and
the second group of stagger FETs, the group of pull-down FETs, the first group of bypass FETs, the third boost FET, and the fourth boost FET are N-type FETs (NFETs).

5. The electronic device as recited in claim 4 in which the electronic device is an output buffer circuit.

6. The electronic device as recited in claim 1 including a first process-sensing circuit and a second process-sensing circuit, the first process-sensing circuit having:
a first resistive element having a first resistive terminal and a second resistive terminal, the first resistive terminal coupled to a first gate control signal lead;
an XOR gate having a first XOR input, a second XOR input, and an XOR output, the first XOR input being coupled to the first gate control signal lead, the second XOR input being coupled to the second resistive terminal, and
a first capacitor having a first capacitive terminal and a second capacitive terminal, the first capacitive terminal coupled between the second resistive terminal and the second XOR input and the second capacitive terminal coupled to the ground lead.

7. The electronic device as recited in claim 6 in which the second process-sensing circuit includes:
a second resistive element having a third resistive terminal and a fourth resistive terminal, the third resistive terminal coupled to a second gate control signal lead;
an XNOR gate having a first XNOR input, a second XNOR input, and an XNOR output, the first XNOR input being coupled to the second gate control signal lead, the second XNOR input being coupled to the fourth resistive terminal, and
a second capacitor having a third capacitive terminal and a fourth capacitive terminal, the third capacitive terminal coupled between the fourth resistive terminal and the second XNOR input and the fourth capacitive terminal coupled to the ground lead.

8. The electronic device as recited in claim 6 in which the first resistive element is a first sense resistor.

9. The electronic device as recited in claim 6 in which the first resistive element includes:
a first NFET having a first NFET drain, a first NFET source, and a first NFET gate, the first NFET gate coupled to the output domain power lead; and
a first PFET having a first PFET drain, a first PFET source, and a first PFET gate, the first PFET drain coupled to the first NFET source and to the second resistive terminal, the first PFET source coupled to the first NFET drain and to the first resistive terminal, and the first PFET gate coupled to the ground lead.

10. The electronic device as recited in claim 6 in which the electronic device is an integrated circuit chip.

11. The electronic device as recited in claim 2 including:
an input buffer having an input buffer input node, a first input buffer output node, and a second input buffer output node, the input buffer input node coupled to an input signal lead, the input buffer operable to be coupled to an input domain supply lead;
a level shifter circuit having a first level shift input node, a second level shift input node, a first level shift output node, a second level shift output node, and a third level shift output node, the first level shift input node coupled to the first IB output input buffer output node and the second level shift input node coupled to the second IB output input buffer output node; and
a gate control circuit having a first gate control input node, a second gate control input node, a third gate control input node, a first gate control output node, and a second gate control output node, the first gate control input node coupled to the first level shift output node, the second gate control input node coupled to the second level shift output node, the third gate control input node coupled to the third level shift output node, the first gate control output node coupled to the first gate control signal lead, and the second gate control output node coupled to the second gate control signal lead, the level shifter circuit and the gate control circuit operable to be coupled to the output domain power lead.

12. The electronic device as recited in claim 11 in which the electronic device is a voltage level translator chip.

13. A method of performing staggering in an output driver having a first gate control signal lead, a second gate control signal lead, and an output signal lead, the method comprising:
providing a first process-sensing circuit having a first process-sensing input lead and a first process-sensing output lead, the first process-sensing input lead being coupled to the first gate control signal lead;
providing a second process-sensing circuit having a second process-sensing input lead and a second process-sensing output lead, the second process-sensing input lead being coupled to the second gate control signal lead; and
during staggering in the output driver,
selectively bypassing a first group of adjustable stagger resistors based on a first pulse provided on the first process-sensing output lead,
selectively bypassing a second group of adjustable stagger resistors based on a second pulse provided on the second process-sensing output lead, and
selectively boosting an output signal on the output signal lead based on the first pulse and the second pulse.

14. The method as recited in claim 13 in which providing the first process-sensing circuit includes:
providing a first resistive element having a first resistive terminal and a second resistive terminal, the first resistive terminal coupled to the first process-sensing input lead;
providing an XOR gate having a first XOR input, a second XOR input, and an XOR output, the first XOR input being coupled to the first process-sensing input lead, the second XOR input being coupled to the second resistive terminal, and
providing a first capacitor having a first capacitive terminal and a second capacitive terminal, the first capacitive terminal coupled between the second resistive terminal and the second XOR input, and the second capacitive terminal coupled to a ground lead.

15. The method as recited in claim 14 in which providing the first resistive element includes providing a first sense resistor.

16. The method as recited in claim 14 in which providing the first resistive element includes providing a first N-type field effect transistor (NFET) and a first P-type field effect transistor (PFET), a drain of the first NFET coupled to a source of the first PFET and to the first resistive terminal, a source of the first NFET coupled to a drain of the first PFET and to the second resistive terminal, a gate of the first NFET coupled to an output domain power lead, and a gate of the PFET coupled to the ground lead.

17. The method as recited in claim 14 in which providing the second process-sensing circuit includes:
  providing a second resistive element having a third resistive terminal and a fourth resistive terminal, the third resistive terminal coupled to the second process-sensing input lead;
  providing an XNOR gate having a first XNOR input, a second XNOR input, and an XNOR output, the first XNOR input being coupled to the second process-sensing input lead, the second XNOR input being coupled to the fourth resistive terminal, and
  providing a second capacitor having a third capacitive terminal and a fourth capacitive terminal, the third capacitive terminal coupled between the fourth resistive terminal and the second XNOR input, and the fourth capacitive terminal coupled to a ground lead.

18. The method as recited in claim 17 in which providing the second resistive element includes providing a second sense resistor.

19. The method as recited in claim 17 in which providing the second resistive element includes providing a second NFET and a second PFET, a drain of the second NFET coupled to a source of the second PFET and to the third resistive terminal, a source of the second NFET coupled to a drain of the second PFET and to the fourth resistive terminal, a gate of the second NFET coupled to the output domain power lead, and a gate of the second PFET coupled to the ground lead.

20. The method as recited in claim 13 in which selectively boosting the output signal includes:
  coupling a first boost FET in series with a second boost FET between an output domain power lead and the output signal lead, the second boost FET having a gate coupled to the first gate control signal lead;
  coupling a third boost FET, and a fourth boost FET in series between the output signal lead and the ground lead, the third boost FET having a gate coupled to the second gate control signal lead,
  controlling the first boost FET using an inverted version of the first pulse; and
  controlling the fourth boost FET using an inverted version of the second pulse.

* * * * *